United States Patent [19]

Newell et al.

[11] Patent Number: 4,785,240

[45] Date of Patent: Nov. 15, 1988

[54] PROXIMITY SWITCH

[75] Inventors: Edwin R. Newell, Fletcher; Terry E. Franks, Leicester; Thomas R. Phelps, Asheville, all of N.C.; J. Michael Boozer, Hampton, N.J.

[73] Assignee: Square D Company, Palatine, Ill.

[21] Appl. No.: 168,599

[22] Filed: Mar. 4, 1988

Related U.S. Application Data

[63] Continuation of Ser. No. 655,817, Oct. 1, 1984.

[51] Int. Cl.[4] ............................................. G01B 7/14
[52] U.S. Cl. .................................... 324/207; 200/303; 324/246; 361/150; 439/13
[58] Field of Search ............. 324/207, 208, 246, 248; 361/203, 180; 339/5 R, 5 A, 5 M, 5 P, 6 A, 7, 8 R, 8 A; 307/116; 331/65; 200/303

[56] References Cited

U.S. PATENT DOCUMENTS

| | | | |
|---|---|---|---|
| 4,314,310 | 2/1982 | Schmidt | 361/331 |
| 4,382,647 | 5/1983 | Poley | 339/7 |
| 4,420,651 | 12/1983 | Teich | 200/303 X |
| 4,475,779 | 10/1984 | Töhl | 339/5 M |

Primary Examiner—Reinhard J. Eisenzopf
Assistant Examiner—Robert W. Mueller
Attorney, Agent, or Firm—Richard T. Guttman; A. Sidney Johnston; Norton Lesser

[57] ABSTRACT

A proximity switch including a base assembly rotatably carries a sensing head formed of a support part rotatable about one axis extending through a base assembly for positioning a sensing face on a complementary sensing part in any one of four planes parallel to the one axis. A pivot between for the support and sensing parts enable the sensing face to be placed in a plane transverse to the one axis by rotation about a second axis at 45° to the one axis. Flexible connections extend along the one axis and stops between the sensing and support parts avoid undue twisting of the connections. An annular printed circuit board supported by the base assembly and a plurality of fine wires carried on an elastomeric member supported in the support part provides separable multiple connections between each conductor on the board and the flexible connections. A single fastening member retained by the base assembly and passing along the one axis through the board to either of a pair of diametrically opposed equally radially spaced fastening inserts in the sensing part permit the sensing head to be detachably secured to the base assembly in each plane and places the wires in pressure engagement with the conductors on the board.

11 Claims, 6 Drawing Sheets

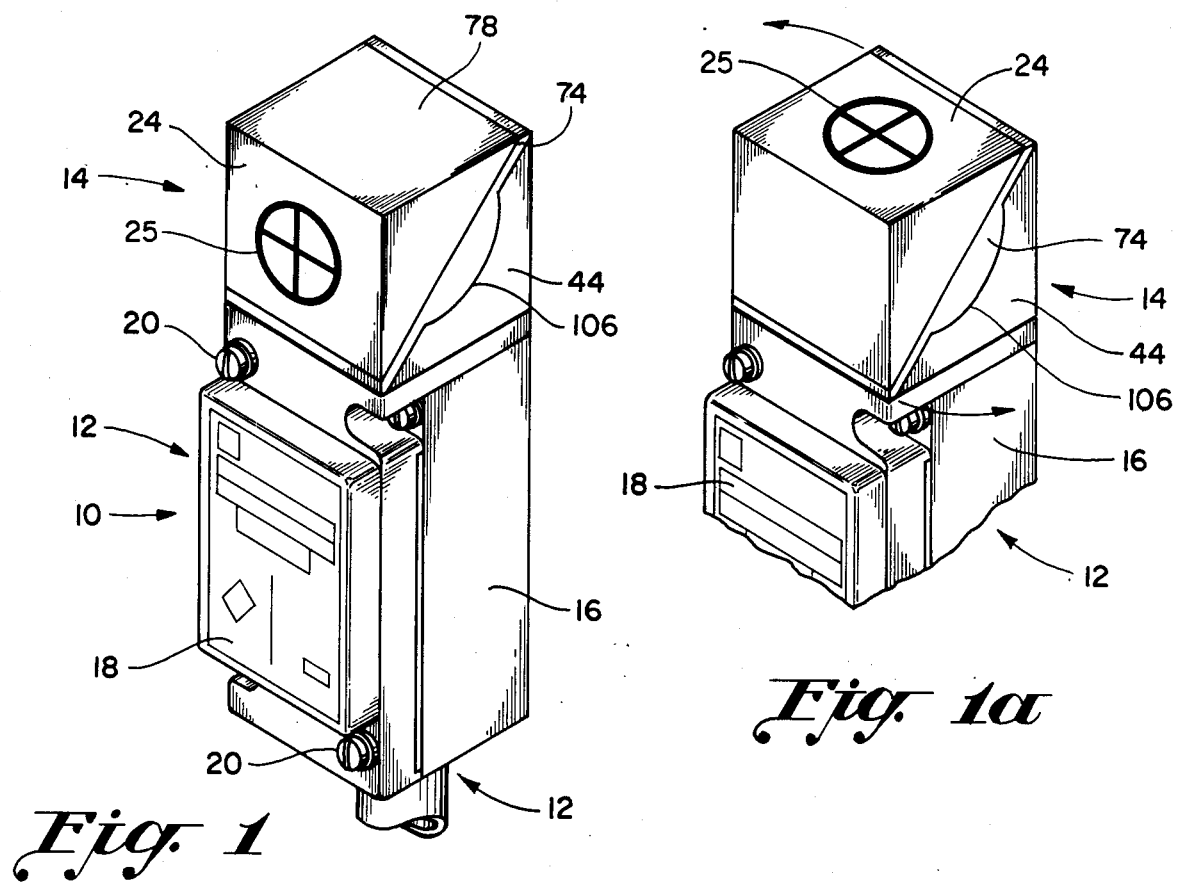
Fig. 1
Fig. 1a
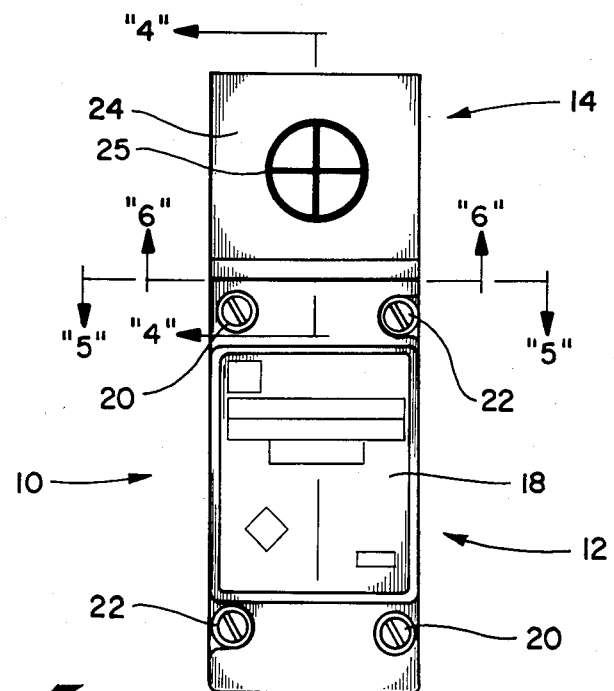
Fig. 3

PROXIMITY SWITCH

This is a continuation of co-pending application Ser. No. 655,817 filed on Oct. 1, 1984.

FIELD OF THE INVENTION

This invention relates in general to proximity switches and more particularly to an improved proximity switch capable of sensing an object in any one of five planes.

BACKGROUND OF THE INVENTION

Proximity switches are usually utilized in place of limit switches for sensing the proper passage of an object adjacent a sensing face the switch when inertialess sensing is desired. Proximity switches conventionally include a rotatable sensing head of generally cubical shape on which the sensing face is located. The head is rotatable on a base assembly about one axis to any one of four quadrants to bring the sensing face into a corresponding quadrant, where it can sense the object, after the base assembly is mounted on an appropriate support.

The base assembly mounting arrangement is preset or predetermined for many locations and the rotatable positioning of the head, whose sides are generally coincident with the side perimeter walls of the base assembly provides some versatility in permitting objects in any one of the four quadrants or planes to be sensed irrespective of the preset mounting arrangement.

To extend the versatility of the proximity switches and permit sensing objects passing transverse or perpendicular to the one axis or in a fifth plane, recent proximity switch designs such as shown in U.S. Pat. No. 4,314,310 incorporate a two part sensing head in which one support or base part is rotatable about the one axis and a second or sensing part having the sensing face is rotatable with the one part and relative the one part about a second axis extending at 45° to the first axis.

Rotation about the second axis brings the sensing face on the sensing head into the fifth plane extending perpendicular to the one axis for sensing objects adjacent the sensing face end of the switch.

A number of problems are presented in these types of arrangements since electrical connections must be extended from the base assembly through the first or support part of the sensing head to sensing apparatus located in the second or sensing part adjacent the sensing face for transmitting signals and/or power to and from the sensing apparatus. In the usual case wires are simply strung from the base assembly through the first part to the sensing apparatus. The wires and/or their terminals are however subject to strain if rotated or twisted either too far or without constraint and this situation is further complicated if it is desired to extend numerous connections and/or it is desired to replace the sensing head to provide a different sensing mode, since sensing may be provided inductively by a coil, photo-electrically by a cell and lamp arrangement or a zero force shutter, for example.

Slip rings and brushes have conventionally been used in prior so called four-way proximity switches however these have not been either readily adaptable for five-way sensing, replacement of the sensing head for different types of sensing modes or capable of ensuring connections in the dusty and contaminated atmosphere in which such switches are often used.

It is also desirable that the sensing head be firmly secured in whatever position to which the head has been rotated. Usually a plurality of retaining screws are used to secure the head and different screws are used for each axis of rotation thereby contributing to the possibility of a failure to tighten the screws and to the expense of the installation.

Other problems relate to the spacial arrangement of the support part and sensing part of the sensing head in a five-way proximity switch, since the confines of the parts are limited but must accommodate the sensing apparatus with electrical connections, and a pivot support between the parts together with securing means therefor.

BRIEF SUMMARY OF THE INVENTION

The invention provides a five-way proximity switch in which each connection between the support part of the sensing head and the base assembly is separable and electrical engagement for each connection is provided by more than two contact points to improve reliability. The separable connections eliminate the need for integrally extending wires from the base assembly while facilitating replacement of the sensing head and/or a change in the sensing mode.

Wires passing from the first support part to the sensing part of the sensing head extend along the axis of rotation therebetween to thereby eliminate or reduce the strain while economical stops between the first support part and the sensing part avoid undue twisting or rotation of the wires.

Additionally a single fastening member passing from the base assembly through the support part of the sensing head to the sensing part of the head is adapted to secure the sensing head in any of the four quadrants and the sensing part and in either of two positions 180° apart while permitting facile replacement of the sensing head.

The fastening means in turn is only accessible on dismantling, a top casting portion of the base assembly so that operation cannot thereafter occur without reassembling the base assembly. Partial loosening of the fastening means permits rotation of the sensing head to any of the four quadrants. Complete loosening of the fastening means from the sensing portion permits rotation of the sensing portion relative the base portion of the head and removal from the head from the top casting permits replacement.

Thus the base assembly is provided with a passage communicating with a passage in the support part of the sensing head and coincident with a first pivot axis between the base assembly and sensing head. The fastening member extends along the axis through the passages and an annular printed circuit board encircles the pivot axis. The fastening means is adapted to engage either of two threaded elements carried by the sensing part of the head in diametrically opposed radially equally spaced positions relative a second pivot axis at 45° to the first axis. Rotation of the sensing part relative the second axis positions the sensing face either parallel to the first axis or perpendicular thereto.

Connections are made to conductors on the circuit board by a respective plurality of fine wires carried by an elastomeric member in the sensing head. The fine wires are placed under pressure against the board conductors when the fastening means is secured to either threaded element in the sensing part. The fine wires provide more than two connections to each conductor on the board and to corresponding conductors on a printed circuit board in the sensing head for extending connections to the sensing apparatus. In addition a large number of conductors are provided on the annular printed circuit board to enable facile change from one sensing mode to another in the event it becomes necessary to provide more connections than those needed for inductive or photocell sensing. When the fastening member is disengaged from the sensing part, the sensing head may be simply removed from the base assembly and replaced with new connections established to the base assembly board, when the fastening member is resecured.

The support part includes a hollow pivot support or post extending along the second axis for pivotally supporting the sensing part on the support part and the wires from the board in the sensing head are connected through the hollow pivot support along the second axis to the sensing apparatus in the sensing part for minimizing strain on the wires when the sensing part is rotated relative the support part.

The pivot support projects into a cavity formed in the sensing part and retaining means are provided in the cavity so that the housing for the sensing part may be expanded in the direction of the support part along the pivot axis for thereby providing sufficient volume in the sensing part to accommodate the sensing apparatus and securing means between the parts, while providing a large bearing area between the two parts. The sensing part and supporting part have complementary conical mating bearing surfaces and stops on the respective parts limit the rotation of the sensing part relative the supporting part for avoiding strain on the electrical connections therebetween.

Rotation of the sensing part relative the support pivot to a position intermediate the stops exposes a pair of passages in the sensing part for enabling component adjustment and potting during assembly of the head.

As mentioned, the sensing part carries threaded elements in diametrically opposed equally radially spaced positions relative the second axis for alignment with the passages coincident with the first axis and engagement by the fastening member to secure the sensing head relative the base assembly. This simplifies a change in the sensing face location since merely loosening the screw permits the head to be rotated relative the base for placing the sensing face in any of four quadrants parallel to the first axis and disengagement of the fastening member from the threaded element permits rotation of the sensing face to a position either perpendicular or parallel to the first axis whereafter it is simply resecured.

It is therefore among the objects of the present invention to provide an improved proximity switch having a sensing head with multiple axes of rotation.

It is a further object of the present invention to provide improved electrical connections between the base assembly and sensing head of a proximity switch.

It is another object of the present invention to provide improved and/or more economical replacement of the sensing means in a proximity switch.

Other objects and features of the present invention will become apparent on examination of the following specification and claims together with the drawings.

BRIEF DESCRIPTION OF THE DRAWINGS

FIG. 1 is an isometric view of the assembled proximity switch incorporating the principles of the present invention.

FIG. 1a is a partial isometric view similar to FIG. 1, but showing the sensing face rotated 180° from that shown in FIG. 1.

FIG. 3 is a front elevational view of the proximity switch shown in FIG. 1.

BRIEF DESCRIPTION OF THE INVENTION

Figure 2:
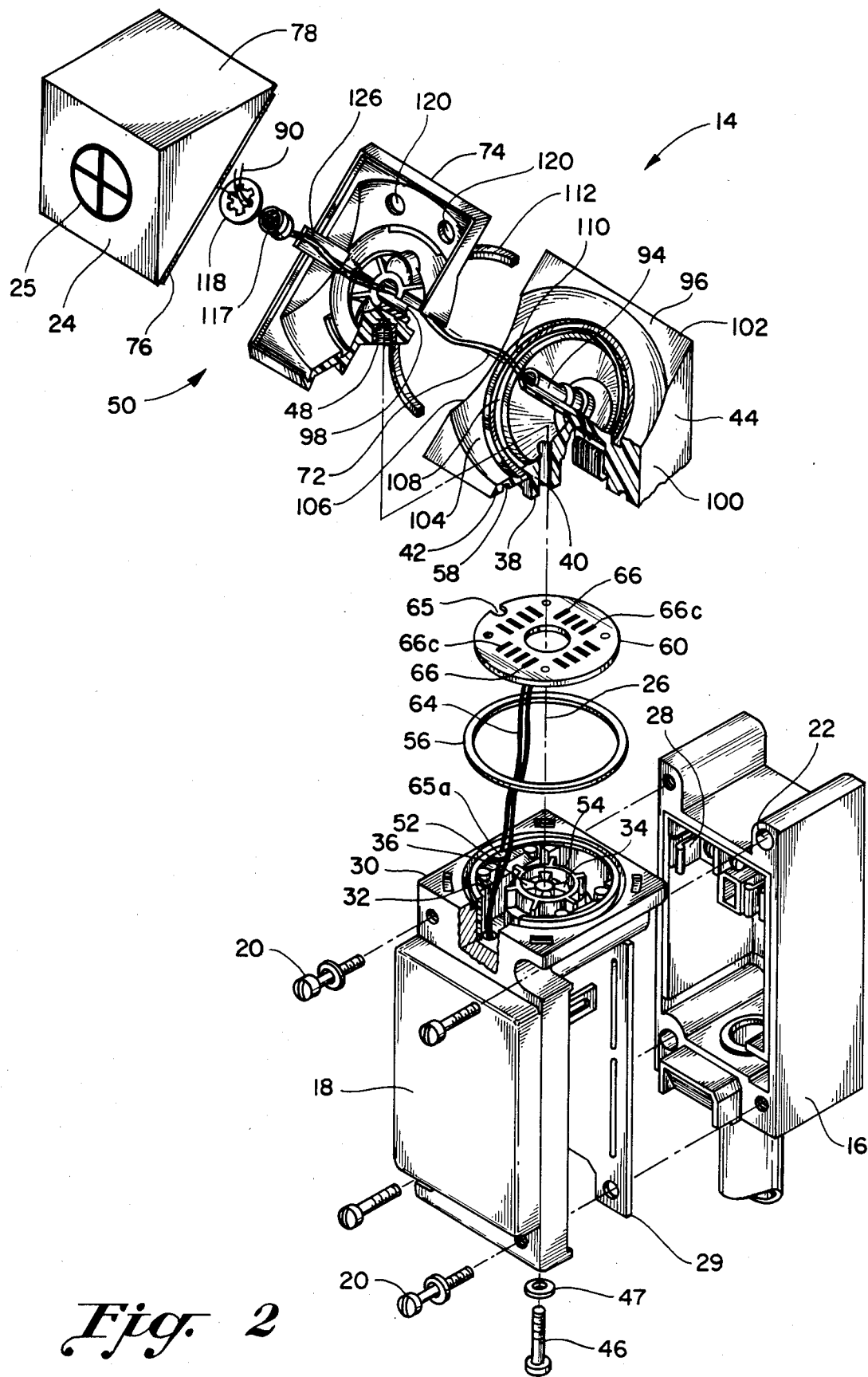
FIG. 2 is an exploded isometric view of the proximity switch shown in FIG. 1.
Figure 4A:
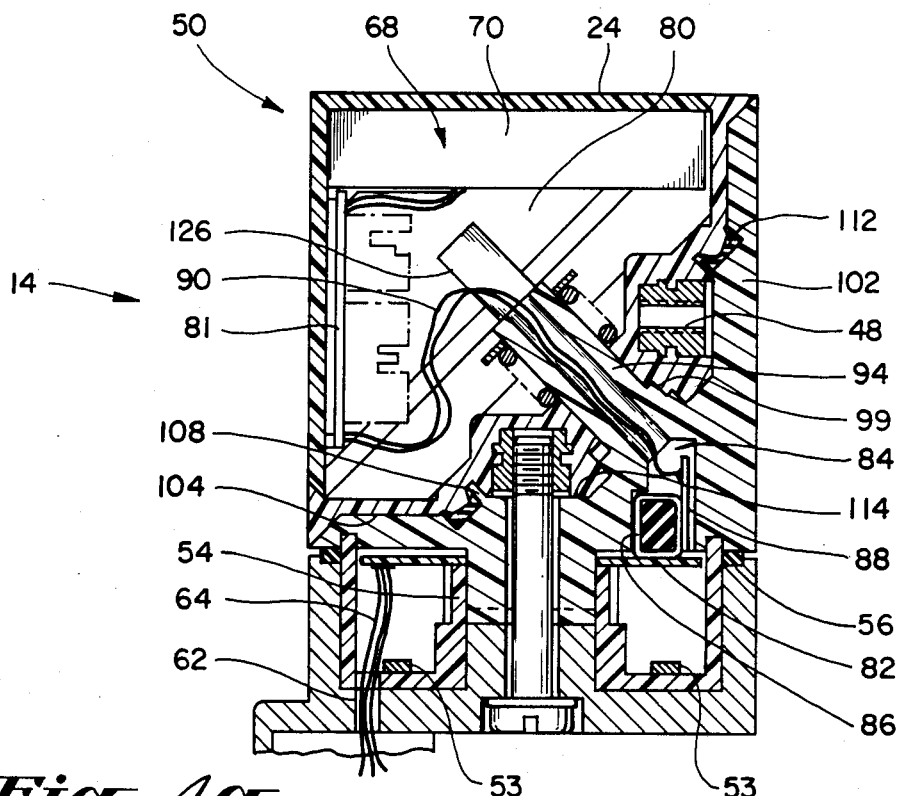
FIG. 4a is a sectional view similar to FIG. 4, but showing the sensing face rotated 180°.
Figure 4:
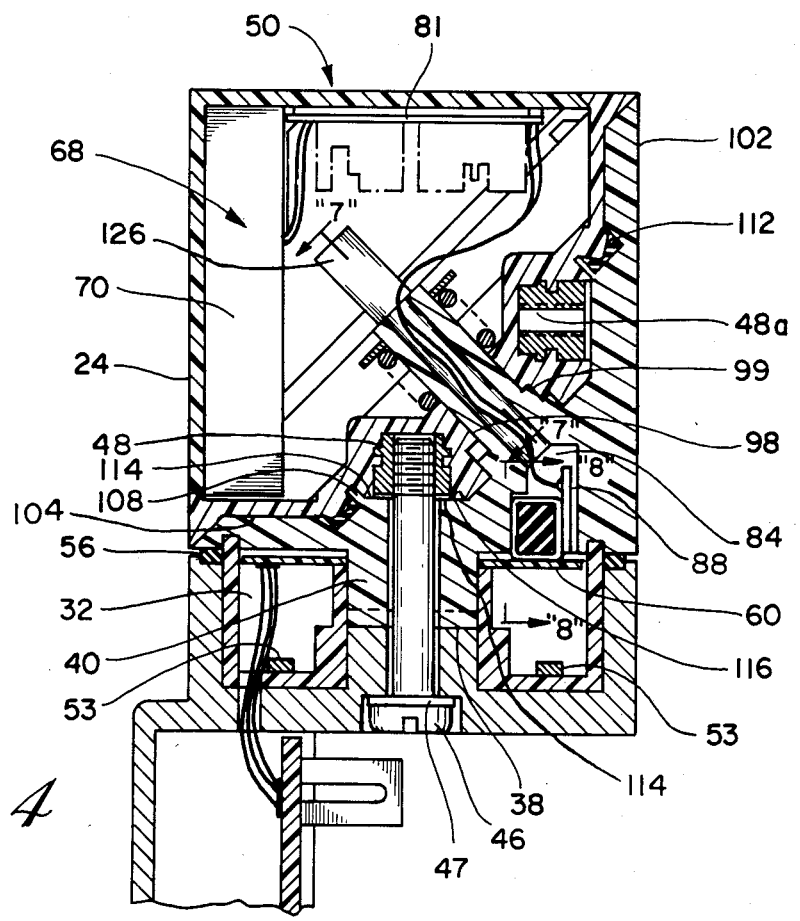
FIG. 4 is a sectional view taken along the line 4—4 in FIG. 3.
Figure 5:
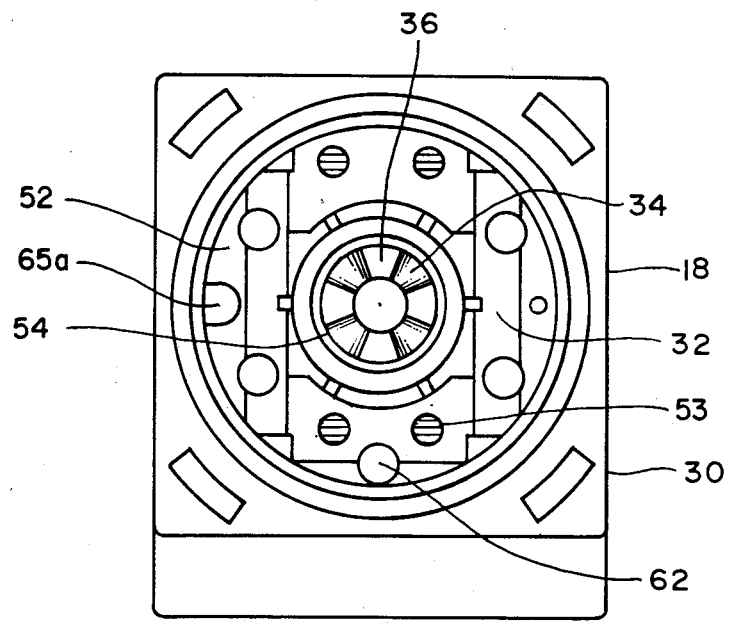
FIG. 5 is a sectional view taken along the line 5—5 in FIG. 3.
Figure 6:
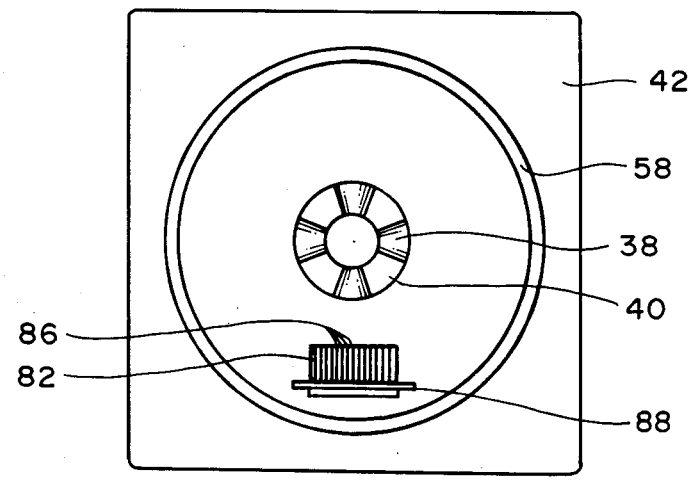
FIG. 6 is a sectional view taken along the line 6—6 in FIG. 3.
Figure 7:
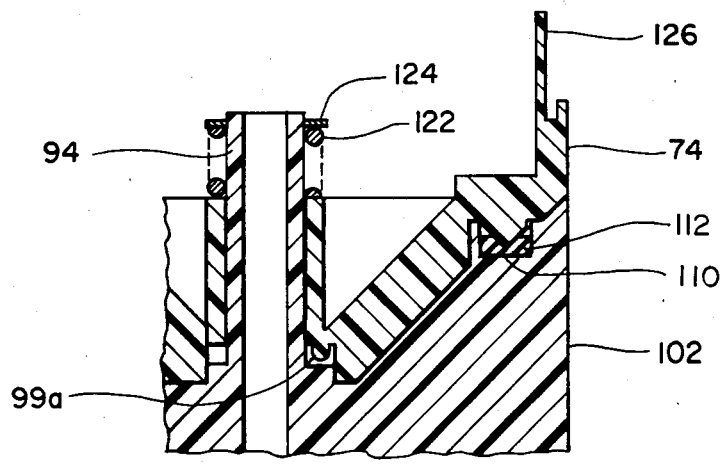
FIG. 7 is a view taken through the line 7—7 in FIG. 4.
Figure 8:
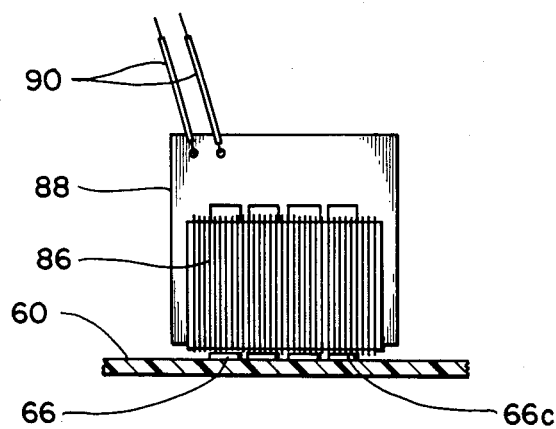
FIG. 8 is a partial sectional view taken along the line 8—8 in FIG. 4.
Figure 9:
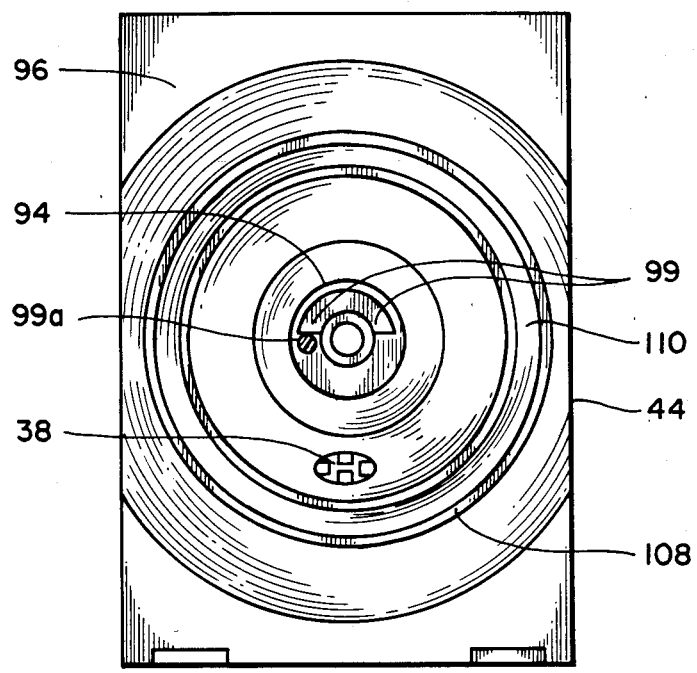
FIG. 9 is a view of the support part looking along the axis of rotation between the sensing part and support part.

Referring to FIG. 1 of the drawings a proximity switch is indicated therein by the reference character 10. The proximity switch comprises a base assembly 12 together with a replaceable rotatable modular sensing head 14 of generally cubical shape whose side perimeter walls are usually coincident with the side walls of the base assembly 12.

The base assembly 12 includes a recessed housing or base member 16, as for example seen in FIG. 2, whose recessed face is closed by one leg of a generally L-shaped top switch casting or assembly 18 secured thereto by screws 20 or the like. Screws 22 in the housing 16 aligned with respective recesses in the top casting 18 enables the entire assembly 10 to be mounted on a support (not shown) in a predetermined position. When assembly 10 is mounted, a target or sensing face 24 on head 14 carrying appropriate indicia 25 is oriented or aligned in correspondence with the path of an object that may be parallel or perpendicular to a longitudinal or first axis 26 of the assembly 10.

Housing 16 carries terminals 28, as seen in FIG. 2, on a terminal block for engagement by respective terminals carried by the switch casting 18 and either or both signal and power leads may extend between respective ones of terminals 28 and the switch casting terminals from leads housed in a conduit secured in the bottom wall of the housing 16.

Casting 18 also carries logic modules and/or other electrical control elements usually mounted on a printed circuit board in casting 18 and generally encapsulated or potted. A gasket 29 is positioned between the one leg of casting 18 and the open face of housing 16 seals the space therebetween.

The other leg 30 of switch casting 18 overlaps the top wall of housing 16 and has a central recess 32 formed therein into which an annular axial boss 34 projects. Annular boss 34 defines a passage therethrough extending through leg 30. A plurality of four equi-angularly spaced detents 36 are formed in the end face of the boss 34. The detents 36 engage intermediate four similarly shaped, sized and spaced detents 38 formed on the end face of a downwardly projecting annular boss 40. Boss 40 is located on the bottom wall 42 of an integrally formed plastic first or support part 44 of the sensing head 14 and engaged detents 36 and 38 position the sensing or target face 24 in any one of four equi-angular positions relative axis 26.

A fastening means or retaining member 46 extends through a sealing washer 47 positioned at the lower end of the passage in leg 30 to seal the passage and through the aligned apertures or passages in bosses 34 and 40. A threaded end portion on member 46 of larger diameter than the passage in boss 34 extends through the boss 40 and base part 44 of the sensing head 14 to engage either of two retaining elements or nuts 48 or 48a held by a sensing part 50 of the sensing head 14. The threaded inserts or retaining nuts 48 and 48a are located in diametrically opposed radially equally spaced positions in the part 50, as will be explained, to enable the target or sensing face 24 to be secured in any one of five positions. Four positions are equi-angular with the sensing face 24 oriented parallel to axis 26 and the fifth position is perpendicular axis 26. The head of member 46 is accessible from the lower side of the leg or wall 30 so that the top casting 18 must be disassembled from housing 16 before the position of sensing head 14 can be changed, while the large diameter threaded portion thereon prevents retraction of the fastening member 46 through the passage in boss 34 and loss thereof.

An electrically insulating molded cup shaped insert 52 is located in the recess 32 and staked projections 53 on the bottom wall of the recess 32 projecting through the bottom wall of the insert 52 secure the insert 52 to the switch casting 18. An inner ring shaped wall 54 on the insert 52 in closely encircling relationship to the boss 34 and projecting therebeyond serves as a guide for the boss 40. A coaxial annular outer wall of the insert 52 seats in a similarly sized groove formed in wall 42. An annular groove in the top surface of leg 30 in coaxial encircling relationship to the outer wall of insert 52 receives a portion of a sealing ring 56 which seats against the bottom surface or wall 42 of part 44 to seal the space between the wall 42 and the recess 32.

An annularly shaped printed circuit board 60 is coaxially seated on wall 54 and on radially and circumferentially spaced ribs or tabs formed on insert 52 between the annular inner and outer walls of the insert 52 and generally coincident with the axial ends of wall 54. A passage 62 extending through the bottom wall of the insert 52 and through the leg 30 into the top casting 18 enables electrical connections 64 to be faciley extended between the circuit elements in the switch casting 18 and the ring or annularly shaped printed circuit board 60. A recess 65 located in the outer peripheral edge of the board 60 engages a tab 65a adjacent the inner edge of the outer ring wall on insert 52 to properly position each of four groups of four printed circuit connectors or conductors 66–66c relative to axis 26.

Each group of connectors 66–66c is spaced radially from axis 26 substantially with each extending parallel to a radial line from axis 26 from legs then ¼" and located in a respective or individually corresponding quadrant relative axis 26 and each conventionally connects through the board 60 to a respective conductor connected in common on the opposite side of the board to one connector of each other group 66–66c. One connector 66–66c in each group is therefore connected through wires 64 to a respective portion of the circuit elements in the switch casting.

As mentioned, the sensing head 14 includes a base or support part 44 formed of plastic, which is rotatable relative the first axis 26 extending vertically or longitudinally through the base assembly 12 and centrally of the head 14 to position the indicia 25 on sensing face 24 adjacent an object passing in a respective plane parallel to the target face 24. This permits sensing apparatus 68 including a sensor such as coil 70 located adjacent the sensing face 24 to sense the object which is in a respective plane parallel to but displaced from the axis 26 or in a plane transverse to axis 26.

The target or sensing part 50 is rotatably carried by the base part 44, as will be explained, for rotation through an angle of 180° about an axis 72 having an angle of 45° to axis 26 for enabling the target face 24 additionally to be located in a fifth position in which axis 26 passes centrally through face 24 to permit sensing objects passing transverse or perpendicularly through the axis 26.

The target or sensing part 50 is formed from two plastic portions comprising a lower portion or wall 74 having an upstanding edge wall for nestingly receiving a complimentary rim edge 76 depending from a perimeter wall of a sensing portion 78 to define a semi-cubically shaped sensing part 50 having a similarly shaped cavity 80.

Sensing apparatus 68 including the sensor or coil 70 adjacent target wall 24 and a printed circuit board 81 having appropriate circuit elements thereon are conventionally secured to the interior of portion 78 in cavity 80 and usually potted. The sensing head 14 may be replaced by a sensing head carrying a photocell and lamp for example or a zero force shutter, however the printed circuit board 60 has a sufficient number of conductors 66–66c to accommodate the connections needed for different types of sensing heads.

Connections to and from the sensing head such as 14 from printed circuit conductors on the base assembly 12 have in prior 4-way proximity switches been established by means of individual spring fingers as before noted. Because of the generally single point contact mode established by each of such fingers, connections do not have the desired degree of reliability nor does the spatial arrangement enable connections for sensing heads incorporating different sensing modes to be easily provided.

To establish both reliable connections and facilitate the use of different sensing modes the present invention utilizes an elastomeric member 82 carried by the support part 44. Member 82 is of desired length to span each group of four conductors 66–66c and has other dimensions substantially ⅛"×0.2" for receipt in a recess 84 formed in wall 42 at a position spaced radially and circumferentially from axis 26. A plurality of individual fine conductors or wires 86 at least partially encircle the elastomeric member in closely spaced but separated positions and these engage conductors corresponding to conductors 66–66c arranged on another printed circuit board 88 located in recess 84. Connection between the conductors on board 88 and the sensing apparatus 68 in part 50 is established by flexible conductors 90 which extend along axis 72.

Each of the conductors 86 on member 82 may have transverse dimensions of, for example, 0.002"×0.005" with a spacing 0.015 center to center while the conductors 66–66c are 0.05" wide in a generally circumferential direction and circumferentially spaced by 0.05". The longitudinal dimension of the elastomeric member 82 extends across the four conductors 66–66c in any group so that a plurality of more than two connections are made to each conductor 66–66c without danger of shorting between adjacent connectors 66-66c. The relatively short circumferential dimension of conductors 66-66c permits a sufficient member to be provided for accommodating sensing heads requiring a relatively large number of connections.

The elastomeric member 82 is confined by the side walls of recess 84 and board 88 and projects with the wires 86 below wall 42. Board 88 carries a number of conductors required for operation of the sensing apparatus and these correspond to a selected number of the conductors 66-66c in any one group on board 60. When retaining member 46 is in threaded into either retaining nut 48 or 48a, the wires 86 are forced against conductors 66-66c and the corresponding conductors on board 88 to establish multiple connections between each of the conductors 66-66c and a respective similarly spaced and sized conductor carried by board 88. The elastomeric member 82 with the assembled conductors 86 are sold by Technit located at 120 Dermody Street, Cranford, N.J. under the trade name Zebra.

The target indicia 25 indicates the location of the coil or sensor 70 and face 24 is brought into juxtaposition with an object to be sensed by rotation of head 14 relative base assembly 16 about the axis 26 and/or rotation of sensing part 50 relative the other or support part 44 about axis 72, which as previously mentioned extends at 45° to the axis 26.

Rotatable support for the sensing part 50 on part 44 is provided by a hollow or annular post 94 integrally formed along axis 72 on the upper surface or wall 96 of the support part 44. Axis 72 and post 94 are coincident with the central axis of parts 44 and 50 and post 94 projects through a bearing 98 formed in the lower wall 74 of part 50 into the central cavity 80 of the sensing part 50. Post 94 has a shoulder extending circumferentially about the post just under 180° to form stop surfaces 99 extending axially of post 94. Surfaces 99 are adapted to engage a tang 99a which depends from wall 74 adjacent bearing 98 to terminate rotation of part 50 in either of two positions 180° apart.

Post 94 also passes wires 90 into the cavity 80 for connection to sensing apparatus 68. Cavity 80 is formed between the lower portion 74 and the upper sensing housing wall 78 of the sensing part 50.

The outer perimeter of support part 44 includes generally triangularly shaped side surfaces or walls 100 extending upwardly from the lower surface or wall 42 and a square back surface or wall 102 to form a generally semi-cubical perimeter in complementary relationship with a semi-cubical perimeter formed by the side surfaces and front surface of parts 74 and 78 with the juncture of the perimeter of part 74 and walls 100 generally following a line at 45° to axis 26 and 90° to axis 72.

The surface 96 is provided with planar margins adjacent the upper and lower ends for engagement with similar margins on the lower surface of portion 74. Intermediate the margins and axis 72 a first conical or annular surface 104 is provided on surface 96 for receiving a complementary surface on portion 74 and both are on a large diameter than the spacing between walls 100 to intersect the upper margin of walls 100 and create a parabolic shaped mating edge 106 between surfaces 100 and the bottom edge of portion 74. This provides a visual and tactile clue of the alignment between parts 44 and 50.

Intermediate the conical shape 104 and post 94 a radial wall 108 is formed adjacent shape 104 and an annular groove 110 in wall 108 receives an annular sealing ring 112 encircling post 94 and bearing 98. Ring 112 engaged by an annular projection on wall 74 therefore serves to seal the space between wall 74 and 96 and prevent contaminants from passing around screw 46 and entering the top casting. A second annular conical surface 114 of smaller diameter is formed at the radially inward end of wall 108 for engagement by a complementary surface on portion 74.

Conical surface 114 is radially coincident with the passage in the boss 40 and a complementary conical surface 116 on portion 74. Nuts 48 and 48a are radially equally spaced in diametrically opposed positions relative axis 72, and fixed in portion 74 adjacent surface 116. Nuts 48 and 48a may thus be individually brought into alignment with the passage in boss 40 by rotation of part 50 relative post 44 about axis 72. When surfaces or walls 100 are aligned with the complementary side surfaces or portions 74 and 78 a respective stop 99 on post 94 engages tang 99a to align a respective one of the nuts 48 or 48a with the passage in boss 40. The passage in boss 40 is in turn aligned with the passage in boss 34 when the detents 36 and 38 are engaged to enable the screw 46 to be engaged with a respective nut 48 or 48a. It will be appreciated that nuts 48 and 48a although shown as separate metallic inserts bonded in portion 74 may in some circumstances be integrally formed therein.

Post 94 in cavity 80 receives a helical coil spring 117 whose lower end bears against the upper surface of portion 74 adjacent bearing 98. The upper end of the spring bears against a spring thrust washer 118 having radially inwardly directed tines or fingers for engaging the post 94 and retaining the sensing part 50 rotatably secured on the support part 44 under the pressure of spring 122. This pressure is applied against sealing ring 112, as indicated, to ensure a good seal.

As mentioned the sensing part 50 is formed of two portions 74 and 78 with portion 74 having lower surfaces complementary to upper surface 96 of support part 44 for rotatable bearing support thereon. The conical lower surfaces on portion 74 directed along axis 72 toward part 44 form an enlarged recess intermediate the outer edge of portion 74 and bearing 96 and with the perimeter wall of portion 78 provides sufficient volume in cavity 80 to accommodate the sensing apparatus 68, post 94, spring 122 and washer 124.

Additionally a pair of upstanding legs 126 are formed on portion 74 for engagement in portion 78, which is assembled to portion 74 by nested engagement of the wall edges and conventional bonding or securement.

Thus the wall 74 is assembled to part 44 by first inserting post 94 through bearing 98 and then assembling the spring 117 and washer 118 to the post 94. Wall 78 carrying sensing apparatus 68 is then assembled to wall 74 with ring 112 therebetween. With portions 74 and 78 rotated from a position in which the planar end margins on surfaces 96 and wall 74 and mating edges 106 are aligned to a position of nonalignment or 90° therefrom a pair of spaced passages 120 in the wall 74 are exposed. Potentiometer or component adjustment may be done through one passage and a potting compound is inserted in one of the passages to fill the cavity 80, while the other passage 120 serves as a vent.

Housing 16 of proximity switch 10 is mounted on a suitable support independently of casting 18 by means of respective fastening members passing through openings 22 in the housing 16. With retaining member 46 loosened from either nut 48 or 48a sensing head 14 is free to be moved axially relative casting 18 to disengage detents 36 and 38 so that head 14 may be rotated relative casting 18. With screw 46 completely free of nut 48 or 48a, part 50 may be rotated relative part 44 for bringing the target face 24 either perpendicular to axis 26 or parallel thereto. If an object to be sensed is to pass through the axis 26, target face 24 is brought into position perpendicular to the axis 26 or if the object is to pass in a plane parallel to axis 26 face 24 is brought into a corresponding plane. In either event the face 24 may be oriented relative any one of four quadrants located 90° apart about axis 26 by simple rotational alignment of the detents 36 and 38 and their axial engagement, whereafter screw 46 is engaged with a respective nut 48 or 48a to secure the head 14 to casting 18.

Thus to change the position of target face 24 and for example arrange the face perpendicular to axis 26 for end sensing, the casting 18 is disassembled from housing 16 to provide access to screw 46. Screw 46 is then disengaged from nut 48, while the large threaded diameter of the screw retains screw 46 in the top casting 18. Sensing part 50 is then simply rotated 180° about post 94 and axis 72 to bring face 24 to a position perpendicular to axis 26 at which position the stop or tang 99a engages one of the shoulders or stops 99 and align edge 106 and align walls 100 with the complementary walls on portions 74 and 78. The nut 48a is thus brought into alignment with the passage in boss 40. The sensing head 14 is rotatably aligned relative axis 26 with casting 18 and the detents on boss 40 axially engaged with the detents on boss 34. The screw 46 is then threaded into nut 48a, which is now aligned with the passages in bosses 34 and 40 to secure the sensing head in the desired position.

The electrical connections extended from the top casting to conductors 66–66c and then extended through respective wires 86 to apparatus 68 with the screw 46 applying pressure between the wires 86 to both the conductors on boards 60 and 88 for establishing multiple contacts to the conductors on each board and the elastomer deforming to accommodate the pressure. Rotation of portion 50 relative portion 44 places minimum strain on wires 90 since they are aligned with axis 72 and undue twisting is prevented by stops 99 and tang 99a. The top casting 18 together with the head 14 are then assembled to the housing 16 and the sensor 70 is then enabled to sense an object passing thereabove.

To orient face 24 in a plane parallel to axis 26 the screw 46 is disengaged from nut 48a and part 50 rotated in the reverse direction for 180° to align nut 48 with the boss 40 and stop or tang 99a engages the opposite stop 99 whereafter screw 46 is engaged with nut 48 and head 14 secured to the casting 18 as described.

To change the orientation of sensor 70 relative axis 26, the casting 18 must be disassembled from housing 16. Fastener 46 may be simply loosened from the respective nut 48 or 48a to permit axial disengagement of detents 36 and 38. Head 14 is then rotated to the desired position about axis 26 whereafter screw 46 is again engaged with the respective nut 48 or 48a and the casting reassembled to housing 16.

With the described arrangement the possibility that head 14 will not be securely positioned is minimized since only one fastener 46 is required to secure the head on casting 18. To replace head 14 with another head carrying either a lamp and photocell or a zero force shutter, for example, casting 18 is disassembled and fastener 46 disengaged from a respective one of nuts 48 or 48a and withdrawn from boss 40. The new head is then simply assembled to casting 18, while the conductors 66–66c and provide the required number of connections without the necessity of changing the top casting.

The invention incorporated in the foregoing description is believed embodied in the accompanying claims.

What we claim is:

1. An improved proximity switch for sensing an object in any one of a plurality of different planes, comprising:

a base assembly (16, 18) having a first connecting portion;

a first support part (44) rotatably mounted at said first connecting portion for rotation about a first axis (26);

a post (94) fixedly attached to said first support part (44), said post (94) defining a second axis (72) intersecting said first axis (26) at an angle of substantially 45°;

a sensing part (50) mounted for rotation about said post (94), said sensing part (50) having a substantially conical cavity formed therein, said substantially conical cavity having an axis substantially coincident with said second axis (72); and, sensing apparatus (68) mounted within said sensing part (50) for providing sensitivity at a target face (24) for detecting nearby objects, said substantially conical cavity providing additional volume within said sensing part (50) for mounting said sensing apparatus (68) therein;

rotation of said sensing part (50) substantially 180° about said second axis (72) provides said target face a first position substantially parallel to said first axis (26) and a second position substantially perpendicular to said first axis (26), and rotation of said support part (44) about said first axis, when said target face (24) is in said first position substantially parallel to said first axis (26), provides said target face with a plurality of positions each of which has said target face substantially parallel to said first axis (26);

a fastening member (46) passing from said base assembly (16, 18) into said first support part (44) along said first axis (26);

at least one receiving member (48, 48a) mounted in said sensing part (50) for receiving said fastening member (46) to hold said sensor lower portion (44) in said first position or in said second position, respectively;

a plurality of electrical conductors (86) fixedly mounted on a wall of said sensing part (50) so as to face a mating wall of said base assembly (16, 18);

a plurality of electrical contacts (66, 66C) mounted in said base assembly (16, 18) proximate to and providing electrical connection with at least some of said plurality of electrical conductors (86), in order to establish electrical connection between said sensing apparatus (68) and electrical components mounted in said base assembly (16, 18);

said post (94) is hollow along its axis, electrical wires connected to said sensing apparatus (68) pass through said post (94) along said second axis (72), and said electrical wires connect to selected ones of said plurality of electrical conductors (86);

said fastening member (46) being capable of being tightened into said at least one receiving member (48, 48a) in order to provide mechanical force compressing said plurality of electrical conductors (86) into said plurality of electrical contacts (66, 66C), thereby providing said electrical connection; and, said fastening member (46) locks said sensing part (50) in either said first position or said second position, and also said fastening member (46) locks said first support part (44) in a selected rotation position about said first axis (26).

2. An improved proximity switch for sensing an object in any one of a plurality of different planes, comprising:
   a base assembly (16, 18) having a first connecting portion;
   a first support part (44) rotatably mounted at said first connecting portion for rotation about a first axis (26);
   a post (94) fixedly attached to said first support part (44), said post (94) defining a second axis (72) intersecting said first axis (26) at an angle of substantially 45°;
   a sensing part (50) mounted for rotation about said post (94);
   a fastening member (46) passing from said base assembly (16, 18) into said first support part (44) along said first axis (26);
   two receiving members (48, 48a) mounted in said sensing part (50) for receiving said fastening member (46) to hold said sensor lower portion (44) in said first position or in said second position, respectively;
   sensing apparatus (68) mounted within said sensing part (50) for providing sensitivity at a target face (24) for detecting nearby objects, and
   rotation of said sensing part (50) substantially 180° about said second axis (72) provides said target face a first position substantially parallel to said first axis (26) and a second position substantially perpendicular to said first axis (26), and rotation of said support part (44) about said first axis, when said target face (24) is in said first position substantially parallel to said first axis (26), provides said target face with a plurality of positions each of which has said target face substantially parallel to said first axis (26),
   and said fastening member (46) locks said sensing part (50) in either said first position or said second position, and also said fastening member (46) locks said first support part (44) in a selected rotation position about said first axis (26).

3. An improved proximity switch for sensing an object in any one of a plurality of different planes, comprising:
   a base assembly (16, 18) having a first connecting portion;
   a first support part (44) rotatably mounted at said first connecting portion for rotation about a first axis (26);
   a post (94) fixedly attached to said first support part (44), said post (94) defining a second axis (72) intersecting said first axis (26) at an angle of substantially 45°;
   a sensing part (50) mounted for rotation about said post (94), said sensing part (50) having a substantially conical cavity formed therein, said substantially conical cavity having an axis substantially coincident with said second axis (72); and,
   said sensing part (50) has a substantially cubic shape, and has a lower portion (74) and a sensing portion (78), a junction between said lower portion (74) and said sensing portion (78) being along a plane, said plane passing through a first edge and a second edge of said cubic shape where said first edge and said second edge are parallel and are diagonally opposite edges of said cubic shape, and said plane passes through a diagonal line of a first face and a diagonal line of a second face of said cubic shape where said first face is parallel to said second face, said first face and said second face are joined by said first edge and said second edge, and said first edge joins said diagonal line of said first face, said diagonal line of said first face joins said second edge, and said diagonal line of said second face joins both said first edge and said second edge, thereby said first edge and said second edge and said diagonal line of said first face and said diagonal line of said second face lie in said plane and form a rectangle;
   sensing apparatus (68) mounted within said sensing part (50) for providing sensitivity at a target face (24) for detecting nearby objects, said substantially conical cavity being formed in said lower portion (74) and providing additional volume within said sensing part (50) for mounting said sensing apparatus (68) therein, whereby rotating of said sensing part (50) substantially 180° about said second axis (72) provides said target face a first position substantially parallel to said first axis (26) and a second position substantially perpendicular to said first axis (26), and rotation of said support part (44) about said first axis, when said target face (24) is in said first position substantially parallel to said first axis (26), provides said target face with a plurality of positions each of which has said target face substantially parallel to said first axis (26).

4. An improved proximity switch for sensing an object in any one of a plurality of different planes, comprising:
   a base assembly (16, 18) having a first connecting portion;
   a first support part (44) rotatably mounted at said first connecting portion for rotation about a first axis (26);
   a post (94) fixedly attached to said first support part (44), said post (94) defining a second axis (72) intersecting said first axis (26) at an angle of substantially 45°;
   a sensing part (50) mounted for rotation about said post (94);
   sensing apparatus (68) mounted within said sensing part (50) for providing sensitivity at a target face (24) for detection of objects near to said target face (24);
   a plurality of electrical conductors (86) fixedly mounted on a wall of said sensing part (50) so as to face a mating wall of said base assembly (16, 18);
   a plurality of electrical contacts (66, 66C) mounted in said base assembly (16, 18) proximate to and providing electrical connection with at least some of said plurality of electrical conductors (86), in order to establish electrical connection between said sensing apparatus (68) and electrical components mounted in said base assembly (16, 18), whereby rotation of said sensing part (50) substantially 180° about said second axis (72) provides said target face a first position substantially parallel to said first axis (26) and a second position substantially perpendicular to said first axis (26), and rotation of said support part (44) about said first axis, when said target face (24) is in said first position substantially parallel to said first axis (26), provides said target face with a plurality of positions each of which has said target face substantially parallel to said first axis (26);

a fastening member (46) passing from said base assembly (16, 18) into said first support part (44); and, at least one receiving member (48, 48a) mounted in said sensing part (50) for receiving said fastening member (46), said fastening member (46) being capable of being tightened into said at lease one receiving member (48, 48a) in order to provide mechanical force compressing said plurality of electrical conductors (86) into said plurality of electrical contacts (66, 66C), thereby providing said electrical connection.

5. The apparatus as in claim 4 wherein said post (94) is hollow along its axis, electrical wires connected to said sensing apparatus (68) pass through said post (94) along said second axis (72), and said electrical wires connect to selected ones of said plurality of electrical conductors (86).

6. An improved proximity switch for sensing an object in any one of a plurality of different planes, comprising:

a head;

a base having a connecting portion;

a support portion of said head rotatably mounted at said connecting portion of said base and capable of rotation about a first axis;

a second axis defined in said head and intersecting said first axis at an angle of substantially 45 degrees;

a target face portion of said head for detecting nearby objects, said target face mounted for rotation about said second axis, and rotation of said target face about said second axis being capable of rotating said target face from an orientation perpendicular to said first axis to an orientation parallel to said first axis, and rotation of said support part about said first axis being capable of rotating said target face into selected orientations parallel to said first axis;

said head having a substantially cubic shape, said target face being a face of said cubic shape, said cubic shape being cut along a diagonal plane passing through a first edge and a second edge of said cubic shape where said first edge and said second edge are parallel and are diagonally opposite edges of said cubic shape, and said diagonal plane being substantially perpendicular to said second axis;

a sensor portion of said head formed by at least said target face, a second face of said cubic shape, and said diagonal plane;

a concave wall extending into said support portion, said concave wall forming a cavity between said concave wall and said diagonal plane, and a single volume formed by said cavity and a space enclosed by said sensor portion;

sensing apparatus mounted within said sensor portion, said sensing apparatus capable of providing sensitivity at said target face, said sensing apparatus being mounted within said single volume and occupying space within said sensor portion and within said cavity.

7. The apparatus as in claim 6 wherein said sensing apparatus further comprises a coil, whereby said cavity provides space for a larger coil than can fit into only said sensor portion.

8. An improved proximity switch for sensing an object in any one of a plurality of different planes, comprising:

a head;

a base having a connecting portion;

a support portion of said head rotatably mounted at said connecting portion of said base and capable of rotation about a first axis;

a second axis defined in said head and intersecting said first axis at an angle of substantially 45 degrees;

a target face portion of said head for detecting nearby objects, said target face mounted for rotation about said second axis, and rotation of said target face about said second axis being capable of rotating said target face from an orientation perpendicular to said first axis to an orientation parallel to said first axis, and rotation of said support part about said first axis being capable of rotating said target face into selected orientations parallel to said first axis;

a single fastening member passing from said base into said support part and capable of detachably securing said target face against movement about said first axis and against movement about said second axis;

9. The apparatus as in claim 8 further comprising:

a first threaded member and a second threaded member fixedly attached to said target face, said first and said second threaded members capable of receiving said fastening member, said first threaded member capable of fixing said target face perpendicular to said first axis, and said second threaded member capable of fixing said target face parallel to said first axis.

10. The apparatus as in claim 8 wherein said fastening member further comprises a bolt.

11. The apparatus as in claim 8 further comprising:

said fastening member is a threaded member having a slotted end, and said slotted end being mounted within said base, said base having a cover, said cover capable of being removed from said base, and access to said slotted end of said fastening member being possible only if said cover is removed from said base.

* * * * *